United States Patent
Dey et al.

(10) Patent No.: US 8,643,526 B1
(45) Date of Patent: Feb. 4, 2014

(54) DATA ACQUISITION SYSTEM

(71) Applicants: Sanjoy K. Dey, Noida (IN); Ammisetti V. Prasad, Hyderabad (IN); Mahendra Pal Singh, Noida (IN)

(72) Inventors: Sanjoy K. Dey, Noida (IN); Ammisetti V. Prasad, Hyderabad (IN); Mahendra Pal Singh, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/779,751

(22) Filed: Feb. 28, 2013

(51) Int. Cl.
*H03M 1/12* (2006.01)

(52) U.S. Cl.
USPC .......................................... 341/155; 341/156

(58) Field of Classification Search
USPC .......... 341/155, 156, 172, 118, 120, 141, 122
See application file for complete search history.

(56) References Cited

U.S. PATENT DOCUMENTS

| | | | |
|---|---|---|---|
| 5,554,943 A | 9/1996 | Moreland | |
| 6,831,585 B2 | 12/2004 | Mulder | |
| 7,271,755 B2 | 9/2007 | Mulder | |
| 7,825,837 B1 * | 11/2010 | Khasnis et al. | 341/120 |

OTHER PUBLICATIONS

Christian C. Enz, Gabor C. Temes, "Circuit Techniques for Reducing the Effects of Op-amp Imperfections: Autozeroing, Correlated Double Sampling, and Chopper Stabilization", Proceedings of the IEEE, Nov. 1996, vol. 84, Issue 11, pp. 1584-1614.

* cited by examiner

*Primary Examiner* — Joseph Lauture
(74) *Attorney, Agent, or Firm* — Charles Bergere

(57) ABSTRACT

A data acquisition system for converting an analog input signal to a digital output signal includes a programmable gain amplifier (PGA), an analog to digital converter (ADC), and an averaging module. The PGA generates first and second amplified signals during respective first and second conversion cycles. The first and second amplified signals include respective first and second amplified input signals and first and second sets of offset and noise signals. The first and second amplified input signals have the same polarities, and the first and second sets of offset and noise signals have opposite polarities. The ADC generates first and second digital samples corresponding to the first and second amplified signals respectively and the averaging module averages the first and second digital samples to eliminate the first and second sets of offset and noise signals from the digital output signal.

20 Claims, 2 Drawing Sheets

DATA ACQUISITION SYSTEM

BACKGROUND OF THE INVENTION

The present invention relates generally to analog to digital converters and, more particularly, to an analog to digital data acquisition system with reduced offset and noise.

Data acquisition systems are widely used in modern electronic equipment for converting analog signals to digital signals. These data acquisition systems include a programmable gain amplifier (PGA) and an analog-to-digital converter (ADC). The PGA amplifies an analog input signal and provides the amplified signal to the ADC. The ADC then converts the amplified analog signal to a digital signal in one or more ADC conversion cycles.

However, the PGA adds offset and noise to the analog input signal during amplification, which gets carried forward and degrades the quality of the digital signal generated by the ADC. When such data acquisition systems are used in high-precision industrial, automotive, and medical applications, the offset and noise limits the accuracy of the output.

Conventional data acquisition systems use a chopper-stabilized PGA to reduce offset and low frequency noise. The chopper includes electronic switching devices and circuits for up-modulating the frequency of offset and noise components to a predefined high frequency. A low pass filter (LPF) is connected to the output of the PGA to filter the up-modulated noise and offset signals. However, LPFs are expensive, increase the cost of such data acquisition systems and occupy silicon area.

It would be advantageous to have a data acquisition system that is cost effective, does not require a LPF, has a small area footprint, and that overcomes the above-mentioned limitations of existing data acquisition systems.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
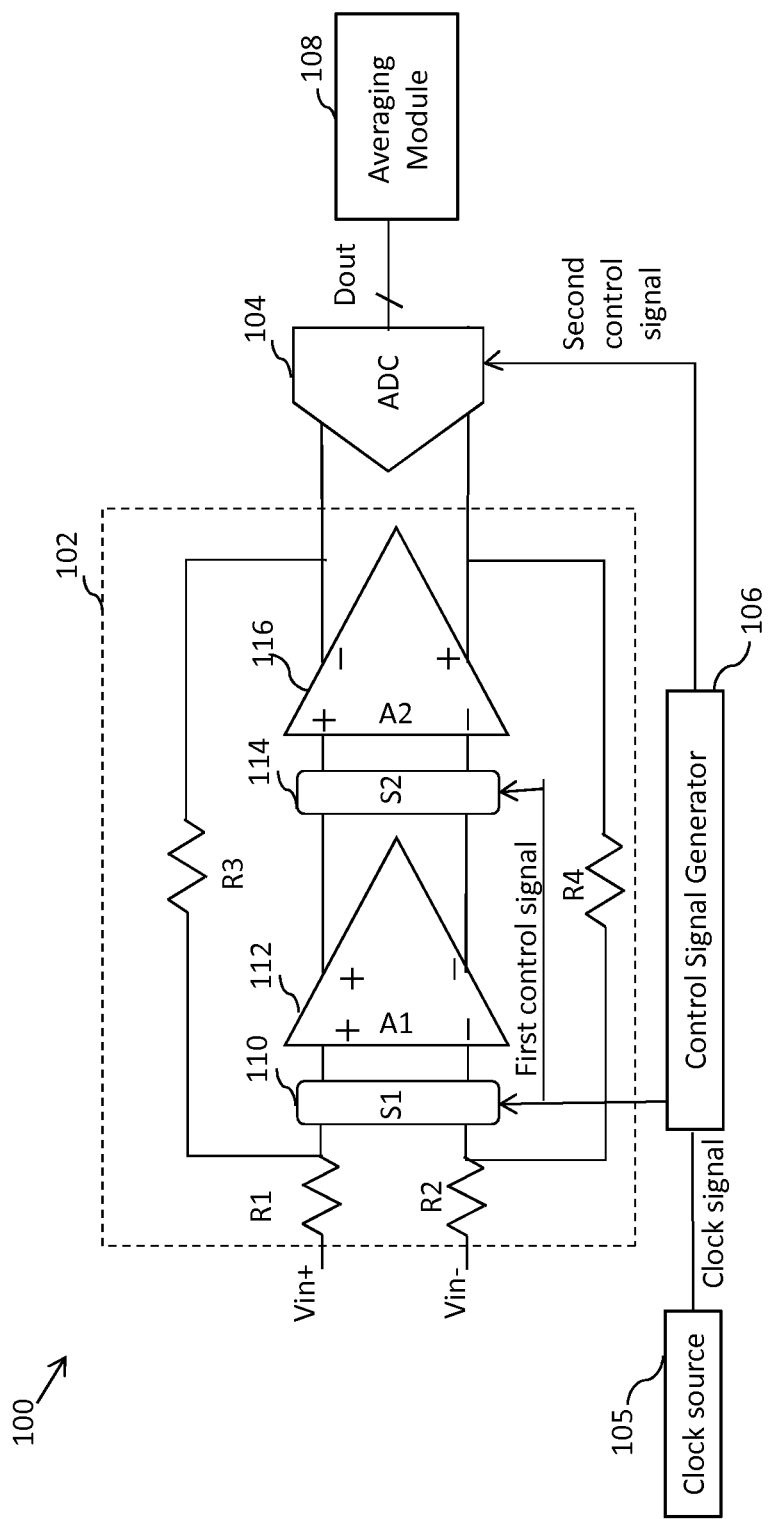
FIG. 1 is a schematic block diagram of a data acquisition system for converting an analog input signal to a digital output signal in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a system for converting an analog input signal to a digital output signal in two or more number of analog-to-digital conversion cycles is provided. The system includes a programmable gain amplifier (PGA), which includes a first switch, a first amplifier, and a second switch. The first switch receives the analog input signal and transmits the analog input signal, during a sampling phase of a first analog-to-digital conversion cycle. The first switch further receives and switches the polarity of the analog input signal to transmit an inverted analog input signal, during a sampling phase of a second analog-to-digital conversion cycle. The first and second analog-to-digital conversion cycles are consecutive conversion cycles. The first amplifier is connected to the first switch, and receives the analog input signal, for generating a first amplified signal during the sampling phase of the first analog-to-digital conversion cycle, wherein the first amplified signal comprises a first amplified input signal and a first set of offset and noise signals. The first amplifier further receives the inverted analog input signal and generates a second amplified signal during the sampling phase of the second analog-to-digital conversion cycle, wherein the second amplified signal comprises a second amplified input signal and a second set of offset and noise signals. The first and second amplified input signals have opposite polarities, and the first and second sets of offset and noise signals have the same polarity. The second switch is connected to the first amplifier and receives and transmits the first amplified signal, during the sampling phase of the first analog-to-digital conversion cycle. The second switch further receives and switches the polarity of the second amplified signal during the sampling phase of the second analog-to-digital conversion cycle, wherein the first and second amplified input signals have the same polarity, and the first and second sets of offset and noise signals have opposite polarities. The system further includes an analog-to-digital converter (ADC), connected to the second switch for sampling the first and second amplified signals to generate first and second digital samples during conversion phases of the first and second analog-to-digital conversion cycles, respectively. The system further includes an averaging module, connected to the ADC for receiving and averaging the first and second digital samples to generate the digital output signal, wherein the averaging module eliminates the first and second sets of offset and noise signals from the digital output signal.

In another embodiment of the present invention, a system for converting an analog input signal to a digital output signal in two or more number of analog-to-digital conversion cycles is provided. The system includes a programmable gain amplifier (PGA), which includes a first switch, a first amplifier, and a second switch. The first switch receives the analog input signal and transmits the analog input signal, during a sampling phase of a first analog-to-digital conversion cycle. The first switch further receives and switches the polarity of the analog input signal to transmit an inverted analog input signal, during a sampling phase of a second analog-to-digital conversion cycle. The first and second analog-to-digital conversion cycles are consecutive conversion cycles. The first amplifier is connected to the first switch and receives the analog input signal for generating a first amplified signal, during the sampling phase of the first analog-to-digital conversion cycle, wherein the first amplified signal comprises a first amplified input signal and a first set of offset and noise signals. The first amplifier further receives the inverted analog input signal and generates a second amplified signal during the sampling phase of the second analog-to-digital conversion cycle, wherein the second amplified signal comprises a second amplified input signal and a second set of offset and noise signals. The first and second amplified input signals have opposite polarities, and the first and second sets of offset and noise signals have the same polarity. The second switch is connected to the first amplifier, and receives and transmits the first amplified signal during the sampling phase of the first analog-to-digital conversion cycle. The second switch further receives and switches the polarity of the second amplified signal, during the sampling phase of the second analog-to-digital conversion cycle, wherein the first and second amplified input signals have the same polarity, and the first and second sets of offset and noise signals have opposite polarities. The system further includes an analog-to-digital converter (ADC) connected to the second switch, for sampling the first and second amplified signals to generate first and second digital samples, during conversion phases of the first and second analog-to-digital conversion cycles, respectively. The system further includes an averaging module connected to the ADC for receiving and averaging the first and second digital samples to generate the digital output signal, wherein the averaging module eliminates the first and second sets of offset and noise signals from the digital output signal.

In yet another embodiment of the present invention, a data acquisition system for converting an analog input signal to a digital output signal in two or more number of analog-to-digital conversion cycles is provided. The data acquisition system includes a programmable gain amplifier (PGA), which includes a first switch, a first amplifier, and a second switch. The first switch receives the analog input signal and transmits the analog input signal during a sampling phase of a first analog-to-digital conversion cycle. The first switch further receives and switches the polarity of the analog input signal to transmit an inverted analog input signal during a sampling phase of a second analog-to-digital conversion cycle. The first and second analog-to-digital conversion cycles are consecutive conversion cycles. The first amplifier is connected to the first switch and receives the analog input signal for generating a first amplified signal during the sampling phase of the first analog-to-digital conversion cycle, wherein the first amplified signal comprises a first amplified input signal and a first set of offset and noise signals. The first amplifier further receives the inverted analog input signal and generates a second amplified signal during the sampling phase of the second analog-to-digital conversion cycle, wherein the second amplified signal comprises a second amplified input signal and a second set of offset and noise signals. The first and second amplified input signals have opposite polarities and the first and second sets of offset and noise signals have the same polarity. The second switch is connected to the first amplifier and receives and transmits the first amplified signal during the sampling phase of the first analog-to-digital conversion cycle. The second switch further receives and switches the polarity of the second amplified signal during the sampling phase of the second analog-to-digital conversion cycle, wherein the first and second amplified input signals have the same polarity and the first and second sets of offset and noise signals have opposite polarities. The data acquisition system further includes an analog-to-digital converter (ADC) connected to the second switch for sampling the first and second amplified signals to generate first and second digital samples during conversion phases of the first and second analog-to-digital conversion cycles, respectively. The data acquisition system further includes an averaging module connected to the ADC for receiving and averaging the first and second digital samples to generate the digital output signal, wherein the averaging module eliminates the first and second sets of offset and noise signals from the digital output signal.

Various embodiments of the present invention provide a data acquisition system for converting an analog input signal to a digital output signal in two or more analog-to-digital conversion cycles. The data acquisition system includes a programmable gain amplifier (PGA), an ADC, and an averaging module. The PGA generates a first amplified signal that includes a first set of offset and noise signals having a positive polarity during the first analog-to-digital conversion cycle and a second amplified signal that includes a second set of offset and noise signals having a negative polarity during the second analog-to-digital conversion cycle. The ADC samples the first and second amplified signals over the first and second analog-to-digital conversion cycles to generate first and second digital samples. The first and second digital samples are averaged by an averaging module, which cancels the noise and offset signals having opposite polarities, and generates the digital output signal. The data acquisition system of the present invention does not require a low pass filter and is cost effective, consumes less power and has a reduced area footprint compared to conventional data acquisition systems.

Referring now to FIG. 1, a schematic diagram illustrating a data acquisition system 100 for converting an analog input signal to a digital output signal in accordance with an embodiment of the present invention is shown. The data acquisition system 100 includes a programmable gain amplifier (PGA) 102, an analog-to-digital converter (ADC) 104, a clock source 105, a control signal generator 106, and an averaging module 108. The data acquisition system 100 receives the analog input signal, amplifies it and converts the amplified analog input signal to the digital output signal.

The PGA 102 includes a first switch 110, a first amplifier 112, a second switch 114, and a second amplifier 116 that are connected in a series configuration. The first amplifier 112 is a high-gain operational amplifier and has differential input and output terminals. The first amplifier 112 receives the analog input signal (differential analog input signal) by way of the first switch 110. The second amplifier 116 is a low gain operational amplifier and also has differential input and output terminals. The second amplifier 116 is connected to the first amplifier 112 by way of the second switch 114. In an alternate embodiment of the present invention, the first and second amplifiers 112 and 116 may single-ended amplifiers capable of receiving single analog input signals. However, in the foregoing, the data acquisition system 100 has been described considering the first and second amplifiers 112 and 116 to be differential amplifiers.

The first and second switches 110 and 114 are analog multiplexers, each having a differential input and a differential output terminal. The differential analog input signal is provided to the first switch 110 by way of resistors R1 and R2. The differential input and output terminals of the PGA 102 are connected to each other by way of resistors R3 and R4. The ADC 104 is connected to the PGA 102 and generates a digital sample corresponding to the analog input signal in one analog-to-digital conversion cycle. An analog-to-digital conversion cycle includes a sampling phase for sampling the analog signal to obtain a sampled voltage which is followed by a conversion phase in which the sampled voltage is converted to the digital sample. The averaging module 108 is connected to the ADC 104 for averaging the digital samples generated by the ADC 104 over multiple analog-to-digital conversion cycles. The averaging module 108 is known in the art and may include a digital adder followed by a right shift, digital divider circuit (not shown). In another embodiment, the digital averaging logic may be programmed in an application-specific integrated circuit (ASIC) or any other equivalent logic circuit which may then be connected to the ADC 104. In yet another embodiment of the present invention, the averaging module 108 may include an averaging filter including a finite impulse response filter (FIR) or an infinite impulse response (IIR) filter.

The control signal generator 106 is connected to the first and second switches 110 and 114 and provides a first control signal thereto and is further connected to the ADC 104 and provides a second control signal thereto. The control signal generator 106 includes at least one of a finite state machine and a digital counter that generates the first and second control signals based on a clock signal received from the clock source 105. The first control signal is hereinafter referred to as a PGA control signal and the second control signal is hereinafter referred to as an ADC control signal. The PGA and ADC control signals are synchronized with each other, and the synchronization between the PGA and ADC control signals with respect to the clock signal is illustrated in detail with reference to FIG. 2.

Figure 2:
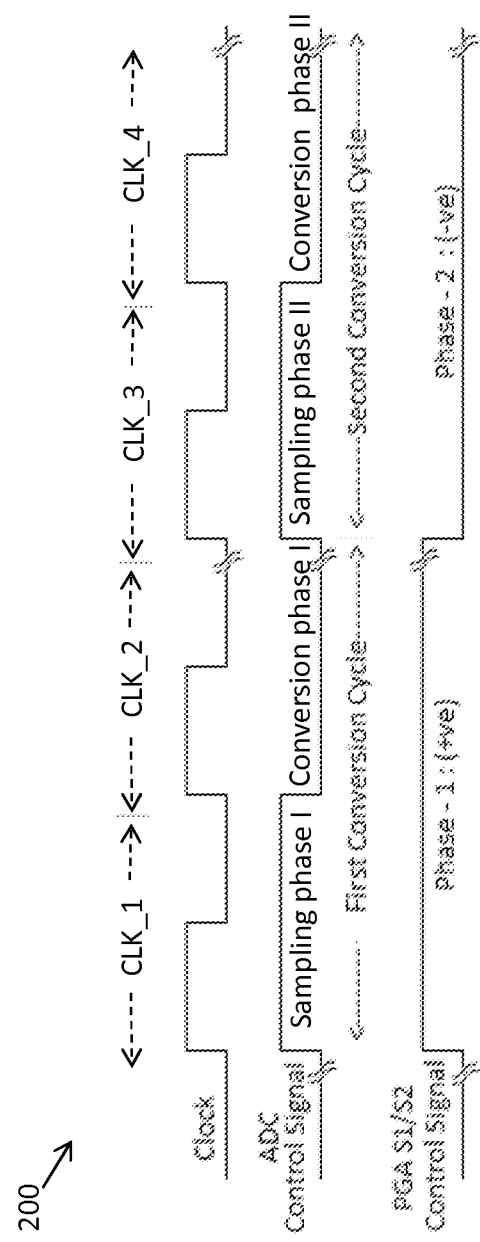
FIG. 2 is a timing diagram illustrating a clock signal and first and second control signals used in the data acquisition system of FIG. 1, in accordance with an embodiment of the present invention.

FIG. 2 is a timing diagram 200 of the clock signal, PGA, and ADC control signals. The operation of the data acquisition system 100 will be explained with reference to the timing diagram 200.

The clock signal is shown to include four clock cycles (CLK_1, CLK_2, CLK_3, and CLK_4). The ADC control signal comprises of analog-to-digital conversion cycles and each analog-to-digital conversion cycle includes a sampling phase and a conversion phase corresponding to one clock cycle. Thus, the first analog-to-digital conversion cycle includes first sampling and conversion phases corresponding to clock cycles CLK_1 and CLK_2 and the second analog-to-digital conversion cycle includes second sampling and conversion phases corresponding to clock cycles CLK_3 and CLK_4, respectively. The PGA control signal has a positive polarity during the first analog-to-digital conversion cycle (corresponding to CLK_1 and CLK_2) and a negative polarity during the second analog-to-digital conversion cycle (corresponding to CLK_3 and CLK_4).

In the first sampling phase, the first switch 110 receives the differential analog input signals (Vin+ and Vin−) at its differential input terminals by way of the resistors R1 and R2. The first switch 110 further receives the PGA control signal from the control signal generator 106. The PGA control signal has a positive polarity and causes the first switch 110 to retain the polarity and magnitude of the analog input signal and transmit the analog input signal.

The first amplifier 112 receives the analog input signal and generates a first amplified signal (Va1). The first amplified signal Va1 includes two components: the amplified analog input signal (Vs) and a first set of offset and noise signals (Vo+Vn) that are added by the first amplifier 112 during amplification.

The second switch 114 receives the first amplified signal Va1 from the first amplifier 112 and the PGA control signal from the control signal generator 106. The PGA control signal has a positive polarity and causes the second switch 114 to retain the polarity of the first amplified signal Va1. The second switch 114 transmits the first amplified signal Va1 to the second amplifier 116.

The second amplifier 116 receives and buffers the first amplified signal Va1. The second amplifier 116 is a low gain amplifier and has a negligible gain compared to that of the first amplifier 112. Therefore, the second amplifier 116 simply transmits the first amplified signal Va1. The ADC 104 receives and samples the first amplified signal Va1 to generate a first digital sample Dout1, during the first conversion phase.

In the second sampling phase, the first switch 110 receives the differential analog input signal (Vin+ and Vin−) at its differential input terminals by way of the resistors R1 and R2. The first switch 110 further receives the PGA control signal from the control signal generator 106. The PGA control signal has a negative polarity and causes the first switch 110 to switch the polarity of the analog input signal, and transmit an inverted analog input signal.

The first amplifier 112 receives the inverted analog input signal and generates a second amplified signal (Va2). The second amplified signal Va2 includes two components, the amplified inverted analog input signal (−Vs) and a second set of offset and noise signals (Vo+Vn) that are introduced by the first amplifier 112 during amplification.

The second switch 114 receives the second amplified signal Va2 from the first amplifier 112 and the PGA control signal from the control signal generator 106. The PGA control signal has a negative polarity and causes the second switch 114 to switch the polarity of the second amplified signal Va2 and transmits the second amplified signal Va2 to the second amplifier 116. The second amplified signal Va2 generated by the second switch 114 includes two components, the amplified analog input signal (Vs) and inverted second set of offset and noise signals (−Vo−Vn).

The second amplifier 116 receives and buffers the second amplified signal Va2. The second amplifier 116 simply transmits the second amplified signal Va2 to the ADC 104 without adding any gain thereto. The ADC 104 receives and samples the second amplified signal Va2 to generate a second digital sample Dout2 during the second conversion phase.

The averaging module 108 averages the first and second digital samples Dout1 and Dout2 to generate a digital output signal Davg. During averaging, the first set of offset and noise (Vo+Vn) and the second set of the offset and noise (−Vo−Vn) get cancelled. Thus, the averaging module 108 eliminates the first and second sets of offset and noise signals from the first and second digital samples Dout1 and Dout2.

Although the averaging module 108 illustrates averaging the digital samples of two consecutive analog-to-digital conversion cycles, it will be apparent to those skilled in the art that the averaging module 108 may average digital samples taken over more than two consecutive analog-to-digital conversion cycles for eliminating the offset and noise from the digital output signal. The error and offset is considerably reduced when even numbers of consecutive digital samples are averaged. The error and offset gradually diminishes with increase in number of averaging samples, when even numbers of consecutive digital samples are averaged.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A system for converting an analog input signal to a digital output signal in two or more analog-to-digital conversion cycles, the system comprising:

a programmable gain amplifier (PGA), comprising:

a first switch, that receives the analog input signal and transmits the analog input signal, during a sampling phase of a first analog-to-digital conversion cycle, and receives and switches a polarity of the analog input signal and transmits an inverted analog input signal, during a sampling phase of a second analog-to-digital conversion cycle, wherein the first and second analog-to-digital conversion cycles are consecutive conversion cycles;

a first amplifier, connected to the first switch, that receives the analog input signal and generates a first amplified signal, during the sampling phase of the first analog-to-digital conversion cycle, wherein the first amplified signal comprises a first amplified input signal and a first set of offset and noise signals, and receives the inverted analog input signal and generates a second amplified signal, during the sampling phase of the second analog-to-digital conversion cycle, wherein the second amplified signal comprises a second amplified input signal and a second set of offset and noise signals, and wherein the first and second amplified input signals have opposite polarities, and the first and second sets of offset and noise signals have the same polarity; and a second switch, connected to the first amplifier, that receives and transmits the first amplified signal, during the sampling phase of the first analog-to-digital conversion cycle, and receives and switches a polarity of the second amplified signal, during the sampling phase of the second analog-to-digital conversion cycle, wherein the first and second amplified input signals have the same polarity, and the first and second sets of offset and noise signals have opposite polarities;

an analog-to-digital converter (ADC), connected to the second switch, that samples the first and second amplified signals, to generate first and second digital samples during conversion phases of the first and second analog-to-digital conversion cycles, respectively; and an averaging module, connected to the ADC, that receives and averages the first and second digital samples to generate the digital output signal, wherein the averaging module eliminates the first and second sets of offset and noise signals from the digital output signal.

2. The system of claim 1, wherein the PGA further comprises a second amplifier, connected between the second switch and the ADC, wherein the second amplifier buffers the first and second amplified signals.

3. The system of claim 1, further comprising a control signal generator, connected to the first and second switches for providing a first control signal thereto, and to the ADC for providing a second control signal thereto.

4. The system of claim 3, wherein the first switch switches the polarity of the analog input signal to generate the inverted analog input signal based on the first control signal, and the second switch switches the polarity of the second amplified signal based on the first control signal.

5. The system of claim 3, further comprising a clock source, connected to the control signal generator, wherein the control signal generator generates the first and second control signals based on the clock source, and synchronizes the switching of the first control signal with the first and second analog-to-digital conversion cycles.

6. The system of claim 3, wherein the control signal generator comprises at least one of a finite state machine and a digital counter.

7. The system of claim 1, wherein the averaging module comprises at least one of an averaging filter and a combination of a digital adder and a divider circuit.

8. The system of claim 1, wherein the first and second switches each comprise an analog multiplexer.

9. A system for converting an analog input signal to a digital output signal in two or more analog-to-digital conversion cycles, the system comprising:

a control signal generator that generates first and second control signals;

a programmable gain amplifier (PGA), comprising:

a first switch, connected to the control signal generator, wherein the first switch receives and transmits the analog input signal based on the first control signal, during a sampling phase of a first analog-to-digital conversion cycle, and receives and switches the polarity of the analog input signal to transmit an inverted analog input signal based on the first control signal during a sampling phase of a second analog-to-digital conversion cycle, wherein the first and second analog-to-digital conversion cycles are consecutive conversion cycles;

a first amplifier, connected to the first switch, wherein the first amplifier receives the analog input signal and generates a first amplified signal during the sampling phase of the first analog-to-digital conversion cycle, wherein the first amplified signal comprises a first amplified input signal and a first set of offset and noise signals, and wherein the first amplifier receives the inverted analog input signal and generates a second amplified signal during the sampling phase of the second analog-to-digital conversion cycle, wherein the second amplified signal comprises a second amplified input signal and a second set of offset and noise signals, and wherein the first and second amplified input signals have opposite polarities and the first and second sets of offset and noise signals have the same polarity; and a second switch, connected to the first amplifier and the control signal generator, wherein the second switch receives and transmits the first amplified signal based on the first control signal during the sampling phase of the first analog-to-digital conversion cycle, and receives and switches the polarity of the second amplified signal based on the first control signal during the sampling phase of the second analog-to-digital conversion cycle, wherein the first and second amplified input signals have the same polarity, and the first and second sets of offset and noise signals have opposite polarities;

an analog-to-digital converter (ADC), connected to the second switch, wherein the ADC samples the first and second amplified signals to generate first and second digital samples during conversion phases of the first and second analog-to-digital conversion cycles, respectively; and an averaging module, connected to the ADC, that receives and averages the first and second digital samples to generate the digital output signal, wherein the averaging module eliminates the first and second sets of offset and noise signals from the digital output signal.

10. The system of claim 9, wherein the PGA further comprises a second amplifier, connected between the second switch and the ADC, wherein the second amplifier buffers the first and second amplified signals.

11. The system of claim 9, further comprising a clock source, connected to the control signal generator, wherein the control signal generator generates the first and second control signals based on the clock source, and synchronizes the switching of the first control signal with the first and second analog-to-digital conversion cycles.

12. The system of claim 9, wherein the control signal generator comprises at least one of a finite state machine and a digital counter.

13. The system of claim 9, wherein the averaging module comprises at least one of an averaging filter, and a combination of a digital adder and divider circuit.

14. The system of claim 9, wherein the first and second switches each comprise an analog multiplexer.

15. A data acquisition system, comprising:
a control signal generator that generates first and second control signals;
a programmable gain amplifier (PGA), comprising:
- a first switch, connected to the control signal generator, wherein the first switch receives and transmits an analog input signal based on the first control signal during a sampling phase of a first analog-to-digital conversion cycle, and wherein the first switch receives and switches the polarity of the analog input signal to transmit an inverted analog input signal based on the first control signal during a sampling phase of a second analog-to-digital conversion cycle, wherein the first and second analog-to-digital conversion cycles are consecutive conversion cycles;
- a first amplifier, connected to the first switch, wherein the first amplifier receives the analog input signal and generates a first amplified signal during the sampling phase of the first analog-to-digital conversion cycle, wherein the first amplified signal comprises a first amplified input signal and a first set of offset and noise signals, and wherein the first amplifier receives the inverted analog input signal and generates a second amplified signal during the sampling phase of the second analog-to-digital conversion cycle, wherein the second amplified signal comprises a second amplified input signal and a second set of offset and noise signals, and wherein the first and second amplified input signals have opposite polarities, and the first and second sets of offset and noise signals have the same polarity; and
- a second switch, connected to the first amplifier and the control signal generator, wherein the second switch receives and transmits the first amplified signal based on the first control signal during the sampling phase of the first analog-to-digital conversion cycle, and receives and switches a polarity of the second amplified signal based on the first control signal during the sampling phase of the second analog-to-digital conversion cycle, wherein the first and second amplified input signals have the same polarity, and the first and second sets of offset and noise signals have opposite polarities;

an analog-to-digital converter (ADC), connected to the second switch, wherein the ADC samples the first and second amplified signals to generate first and second digital samples during conversion phases of the first and second analog-to-digital conversion cycles, respectively; and an averaging module, connected to the ADC, that receives and averages the first and second digital samples to generate a digital output signal, wherein the averaging module eliminates the first and second sets of offset and noise signals from the digital output signal.

16. The data acquisition system of claim 15, wherein the PGA further comprises a second amplifier, connected between the second switch and the ADC, wherein the second amplifier buffers the first and second amplified signals.

17. The data acquisition system of claim 15, further comprising a clock source connected to the control signal generator, wherein the control signal generator generates the first and second control signals based on the clock source, and synchronizes the switching of the first control signal with the first and second analog-to-digital conversion cycles.

18. The data acquisition system of claim 15, wherein the control signal generator comprises at least one of a finite state machine and a digital counter.

19. The data acquisition system of claim 15, wherein the averaging module comprises at least one of an averaging filter and a combination of a digital adder and divider circuit.

20. The data acquisition system of claim 15, wherein the first and second switches each comprise an analog multiplexer.

* * * * *